United States Patent
Cardella

[19]
[11] Patent Number: 5,918,469
[45] Date of Patent: Jul. 6, 1999

[54] COOLING SYSTEM AND METHOD OF COOLING ELECTRONIC DEVICES

[75] Inventor: Mark A. Cardella, Palo Alto, Calif.

[73] Assignee: Silicon Thermal, Inc., Mountain View, Calif.

[21] Appl. No.: 08/585,271

[22] Filed: Jan. 11, 1996

[51] Int. Cl.⁶ .............................. F25B 21/02; F28F 7/00; H02B 1/00
[52] U.S. Cl. .................. 62/3.7; 62/3.3; 62/3.5; 165/80.3; 361/668
[58] Field of Search .................. 62/3.2, 3.3, 3.4, 62/3.5, 3.6, 3.61, 3.62, 3.63, 3.64, 3.7, 259.2; 361/668, 669, 670, 671, 672, 673, 674, 675, 676, 677, 678, 679, 623; 165/135, 80.3

[56] References Cited

U.S. PATENT DOCUMENTS

| | | | |
|---|---|---|---|
| 2,984,077 | 5/1961 | Gaskill | 62/259.2 |
| 3,481,393 | 12/1969 | Chu | 62/3.7 |
| 4,328,676 | 5/1982 | Reed . | |
| 4,432,635 | 2/1984 | Mayer . | |
| 4,566,529 | 1/1986 | Klein . | |
| 4,730,665 | 3/1988 | Cutchaw . | |
| 4,758,926 | 7/1988 | Herrell et al. . | |
| 4,812,733 | 3/1989 | Tobey | 361/388 |
| 4,848,090 | 7/1989 | Peters . | |
| 5,032,897 | 7/1991 | Mansuria et al. . | |
| 5,343,360 | 8/1994 | Sanwo | 62/3.3 |
| 5,456,081 | 10/1995 | Chrysler et al. | 62/3.7 |
| 5,564,276 | 10/1996 | Abadilla et al. | 62/3.7 |
| 5,640,852 | 6/1997 | Atlas | 62/3.7 |

*Primary Examiner*—Henry Bennett
*Assistant Examiner*—Melvin Jones
*Attorney, Agent, or Firm*—Ashok K. Janah

[57] ABSTRACT

The cooling apparatus (20) of the present invention is suitable for cooling electronic devices (22), and comprises a thermoelectric cooler (24) having a hot surface (26) and a cold surface (28), the cold surface (28) in thermal contact with an electronic device (22). A fluid circulator (30) is in thermal contact with the hot surface (26) of the thermoelectric cooler (24), and is capable of flowing heat transfer fluid (32) therein for transporting heat from the hot surface (26) of the thermoelectric cooler (24) to an environment remote from the electronic device (22). A thermal insulator (34) is provided for thermally isolating the electronic device (22) from a contiguous electrical circuit (36), so that the electronic device (22) is cooled substantially without condensation forming on the electronic device (22) or contiguous electrical circuit (36).

48 Claims, 6 Drawing Sheets

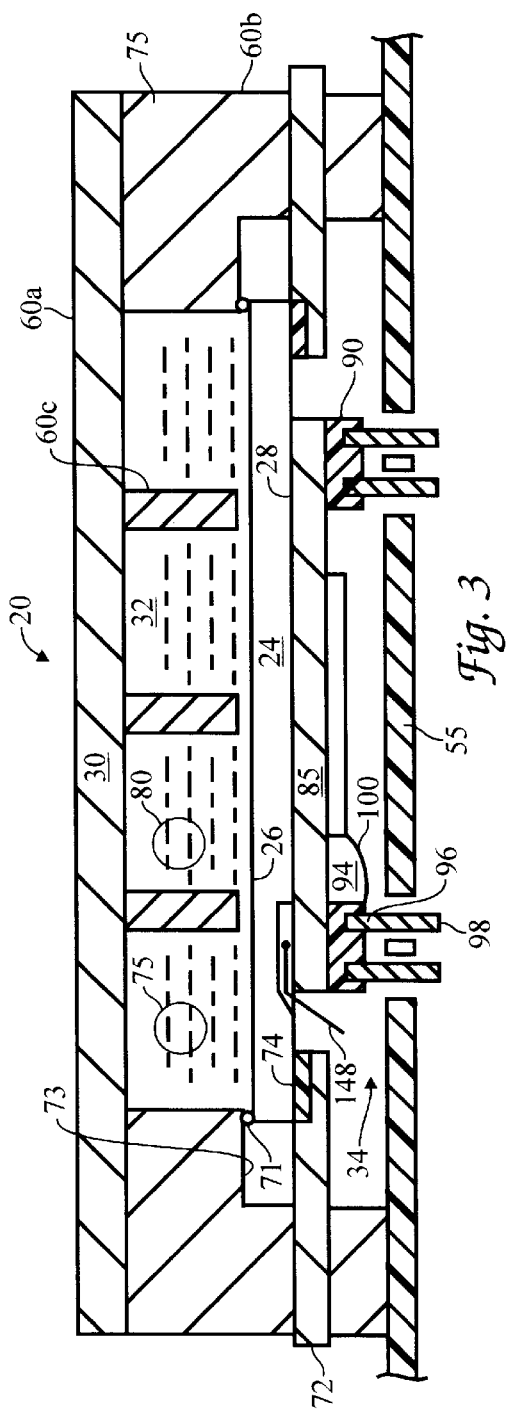
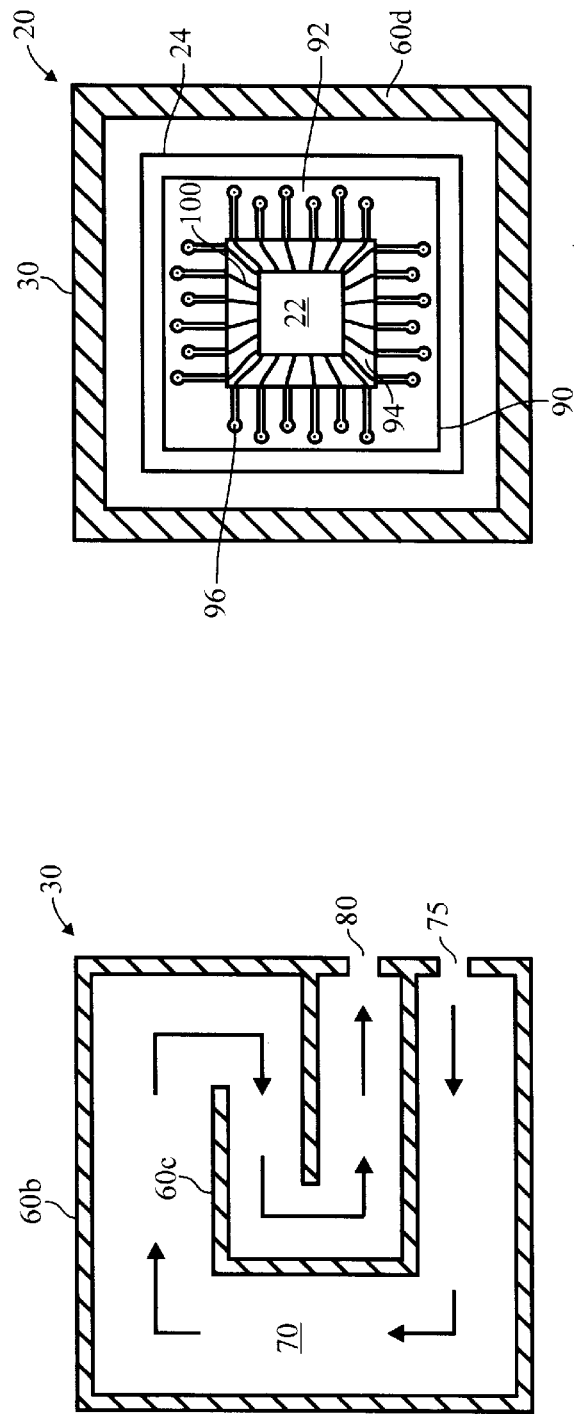

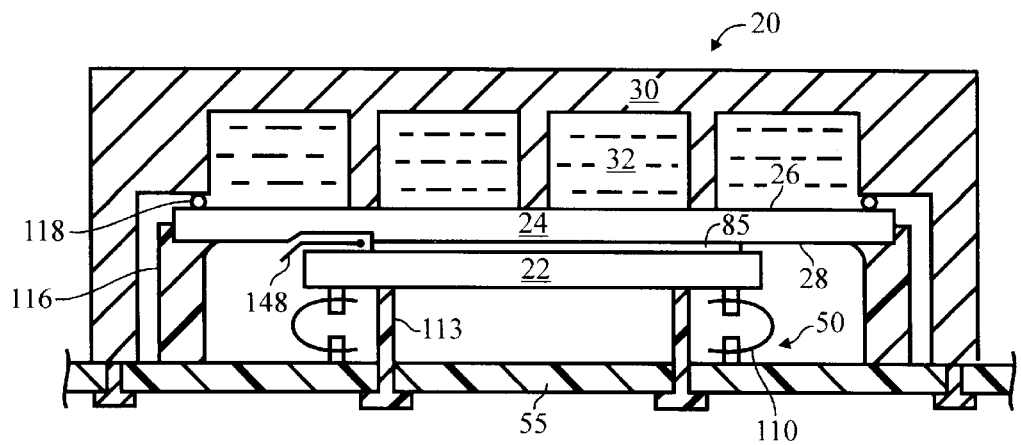
Fig. 6
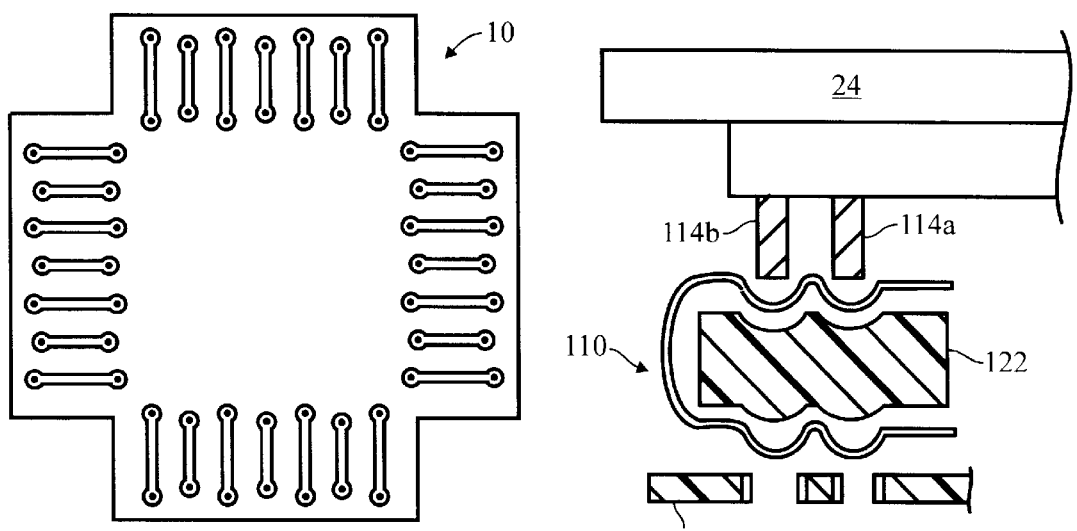
Fig. 7
Fig. 9
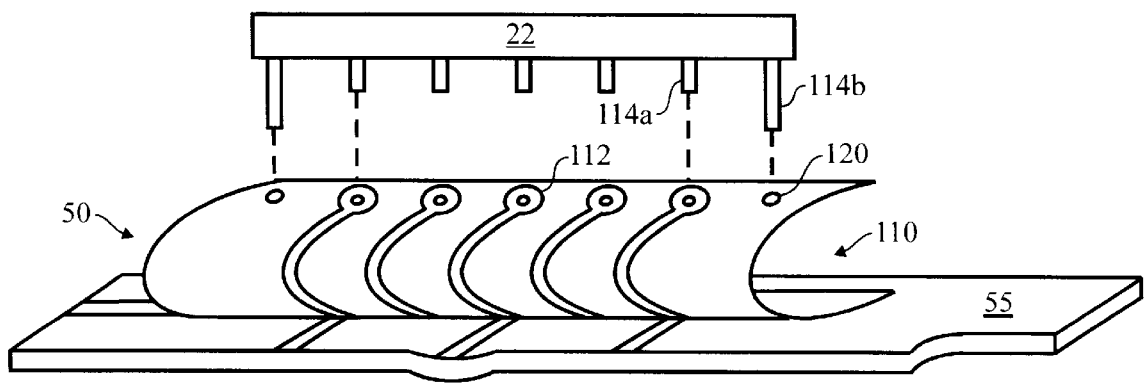
Fig. 8

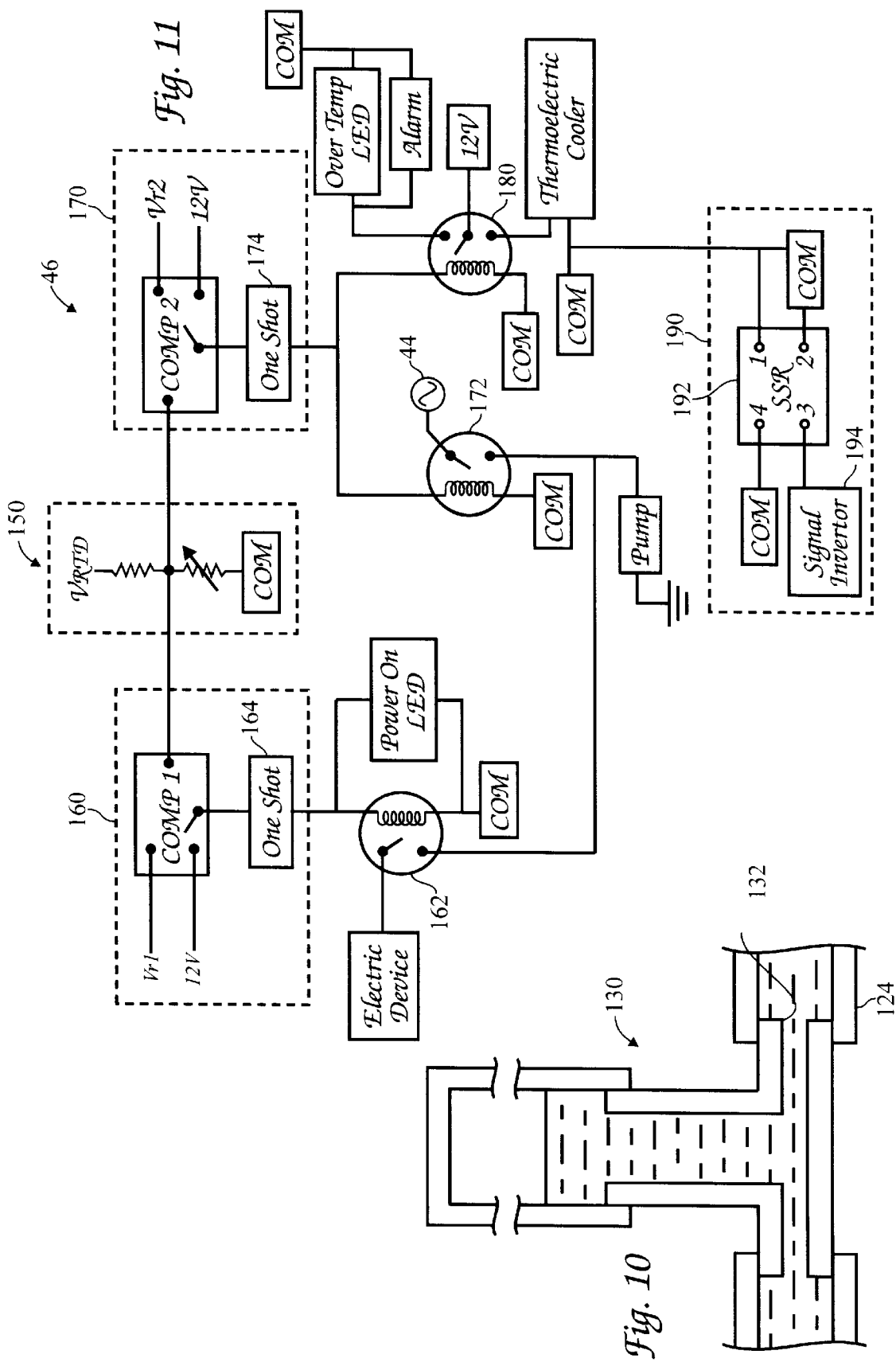

COOLING SYSTEM AND METHOD OF COOLING ELECTRONIC DEVICES

BACKGROUND

The present invention relates to cooling systems for cooling electronic devices, and in particular integrated circuit devices.

Advances in integrated circuit chip technology toward a scaling down of the dimensions of the devices formed on the integrated circuit chip are resulting in increased chip size and complexity. VLSI's (very large-scale integrated circuits) use closely spaced interconnection lines to connect a larger number of scaled down devices in a smaller cross-sectional area than conventional integrated circuits. The increased number of devices operating in a smaller area results in increased heat generation, and reduced heat dissipation within the chip. The combination of increased heat generation and reduced heat dissipation can result in high operating temperatures that reduce the operating reliability of the chip, particularly when the chip is operated at high frequencies. Consequently, the operating frequency of the chip, which reflects the operating speed of the circuit, is limited by the heat generated in the circuit. Also, heat generated in relatively large integrated circuits can result in thermal degradation of the devices in the chip and of surrounding electronic components. Thus, it is desirable to remove the heat generated in the integrated circuit chips to obtain more reliable circuitry at higher operating frequencies.

Traditionally, heat sinks mounted on the chip in combination with fans that direct air flow across the heat sinks, are used to cool the integrated circuit chip. Conventional heat sinks comprise metal fin structures mounted on the packaging of the integrated circuit chip to dissipate the heat generated by the integrated circuit over a large surface area. Fans situated proximate to the metal fins direct air through the fins. However, the metal fins of the heat sinks are limited to sizes suitable for mounting on the integrated circuit chip packages. Because the integrated circuit chip packages have small areas, the metal fin structures are limited in size and do not effectively dissipate the heat generated by the integrated circuit chips. Also, it is often difficult to position the fans close to the integrated circuit chips within housing enclosures containing tightly packed electrical circuitry to achieve a uniform air flow across the metal fins. Thus, integrated circuit chip package temperatures of up to 70° to 100° C. are often prevalent during high speed operation of the chips.

Thermoelectric coolers have also been used to cool the integrated circuit chips. Thermoelectric coolers comprise dissimilar semiconductor elements that are electrically connected at a hot junction and a cold junction. Heat is absorbed at the cold junction at a rate proportional to the number of semiconductor elements and amount of current passed through the elements. One example of a thermoelectric cooled integrated circuit package, disclosed in U.S. Pat. No. 5,032,897, consists of an multilayer ceramic, electrically insulative, thermally conductive, chip carrier module that defines a cavity. A thermoelectric cooler is positioned in the cavity in contact with an integrated circuit, and conductors passing through channels in the module connect the integrated circuit to the external environment.

However, there are several problems with existing thermoelectric cooled packages for integrated circuit chips. One problem is that the heat generated at the hot junction of the thermoelectric cooler during operation of the thermoelectric cooler, increases the temperature within the housing enclosure surrounding the chip. This causes adjacent electrical circuitry and integrated circuit chips to heat up thereby reducing their reliability. Using a fan to cool the thermoelectric cooler only serves to circulate the additional heat generated by the thermoelectric cooler within the housing enclosure. Another problem occurring when the cold junction of the thermoelectric is operated at lower than ambient temperatures, is that condensation of ambient moisture results in dew or frost formation on the integrated circuit device and on the surrounding electrical circuitry. The condensed moisture can cause shorting and electrical failure of the surrounding electrical circuitry. Solutions relating to the use of non-standard custom packages for the integrated circuit chip, as disclosed in U.S. Pat. No. 5,032,897, are expensive to fabricate and do not allow use of existing integrated circuit chip packages.

Another problem arises because conventional electrical circuits often contain several integrated circuit chips mounted in close proximity to one another to obtain faster operating speeds. For example, main memory chips, processor graphics chips, SRAM chips, and cache RAM chips are typically mounted adjacent to one another. However, the closely mounted chips further increase the heat dissipation problems. Conventional cooling methods ineffectively cool the closely mounted chips, particularly because the integrated circuit chip packages have different dimensions and heights, which prevent uniform cooling of the integrated circuits. To prevent overheating, the integrated circuits are operated at lower operating frequencies, reducing the speed of the electrical circuitry.

During the initial power-up of the integrated circuit chips, another problem occurs when the thermoelectric cooler is not yet operating at the desired sub-ambient temperature, or when the temperature of the chip has not stabilized. Operating the integrated circuit chips at high frequencies before uniform cooling of the chip is reached can cause unreliable operation of the integrated circuit chip, resulting in errors during the initial start-up operation of the chip.

A further problem occurs during operation of integrated circuit chips at sub-ambient temperatures. When the chip is operated at low temperatures, thermal expansion stresses are generated between the lower operating temperature chip and the higher operating temperature electrical circuitry, because of the difference in thermal expansion coefficients of the integrated circuit chip and surrounding electrical circuitry. The thermal expansion stresses can cause breakage of the chip, separation of the chip from its mounting, or failure of the electrical leads connecting the chip to the surrounding circuitry.

Thus, there is a need for a cooling system that effectively cools integrated circuit chips so that the circuits can be operated at higher operating frequencies. It is also desirable for the cooling system to cool the integrated circuit, without heating the immediate environment of the circuit. It is further desirable for the cooling system to allow uniform cooling of a cluster of closely mounted integrated circuit packages. It is also desirable for the cooling system to be adaptable for use with existing integrated circuit chip packages.

SUMMARY

The cooling apparatus of the present invention is directed to these needs, and is suitable for cooling at least one electronic device. In one version, the cooling apparatus includes a thermoelectric cooler having a hot surface and a cold surface, the cold surface in thermal contact with the electronic device to be cooled. A fluid circulator is in thermal contact with the hot surface of the thermoelectric cooler, and is capable of flowing heat transfer fluid therein for transporting heat from the hot surface of the thermoelectric cooler to an environment remote from the electronic device. A thermal insulator is provided for thermally isolating the electronic device from the contiguous electrical circuit environment, so that the electronic device is cooled substantially without condensation forming on the electronic device or contiguous environment.

In a preferred version, the cooling system includes a fluid circulating container in thermal contact with the hot surface of the thermoelectric cooler. The fluid circulating container has channels therein for circulating the heat transfer fluid therethrough to absorb heat from the hot surface of the thermoelectric cooler. A pump is provided for circulating heat transfer fluid through the fluid circulating container. A heat dissipator dissipates heat from the heat transfer fluid at a location sufficiently remote from the electrical circuit that the dissipated heat does not heat the electrical circuitry immediately adjacent to the integrated circuit chip.

Another version of the invention is useful for cooling a plurality of electronic devices having an irregular surface topology. This version uses a fluid circulator having a flexible thermally conductive layer that conforms to the irregular surface topology of a plurality of electronic devices to enhance thermal conduction between the electronic devices and the fluid circulator.

The present invention is also directed to a method of cooling electronic devices. In the method, the electronic device is thermally isolated from surrounding electrical circuit. The thermally isolated electronic device is cooled by maintaining a cold surface of a thermoelectric cooler in thermal contact with the electronic device. Heat is removed from the thermoelectric cooler, using a fluid circulator in thermal contact with a hot surface of the thermoelectric cooler. The fluid circulator transports heat from the thermoelectric cooler to a location distant from the electrical circuitry so that the electronic device can be cooled without condensation forming on the electronic device or surrounding electrical circuitry.

DRAWINGS

These and other features, aspects, and advantages of the present invention will become better understood with reference to the following description, appended claims, and accompanying drawings which illustrate versions of the invention, where:

FIG. 3 is a partial cross-sectional schematic side view of a version of the cooling apparatus of the present invention;

FIG. 4 is a partial cross-sectional schematic top view of the fluid circulator of the apparatus of FIG. 3;

FIG. 5 is a cross-sectional schematic bottom view of the cooling apparatus of FIG. 3;

FIG. 6 is a partial cross-sectional schematic side view of another version of the cooling apparatus of the present invention;

FIG. 7 is a schematic top view of the flexible thermal insulator sheet of the cooling apparatus of FIG. 6;

FIG. 8 is a partial schematic exploded side view of the electronic device mounted on a flexible thermal insulator sheet of the apparatus of FIG. 6;

FIG. 9 is a partial cross-sectional schematic side view of the electronic device mounted on a flexible thermal insulator sheet of the apparatus of FIG. 6;

FIG. 10 is a partial cross-sectional schematic side view of a T-shaped tube assembly of the present invention;

FIG. 11 is a diagram of a control circuit of the present invention;

DESCRIPTION

The apparatus of the present invention is suitable for cooling electronic devices, such as an integrated circuits mounted on electrical circuits within a housing enclosure. Although the present invention is illustrated in the context of cooling of integrated circuits, the invention can be used to cool a variety of electronic components including integrated circuits, rectifiers, resistors and electrical circuit boards. Thus, the present invention should not be limited in scope to cooling of integrated circuits, and adaptations and modifications of the invention that render the invention suitable for cooling other electronic components, that would be apparent to those of ordinary skill in the art, are within the scope of the present invention.

Figure 1:
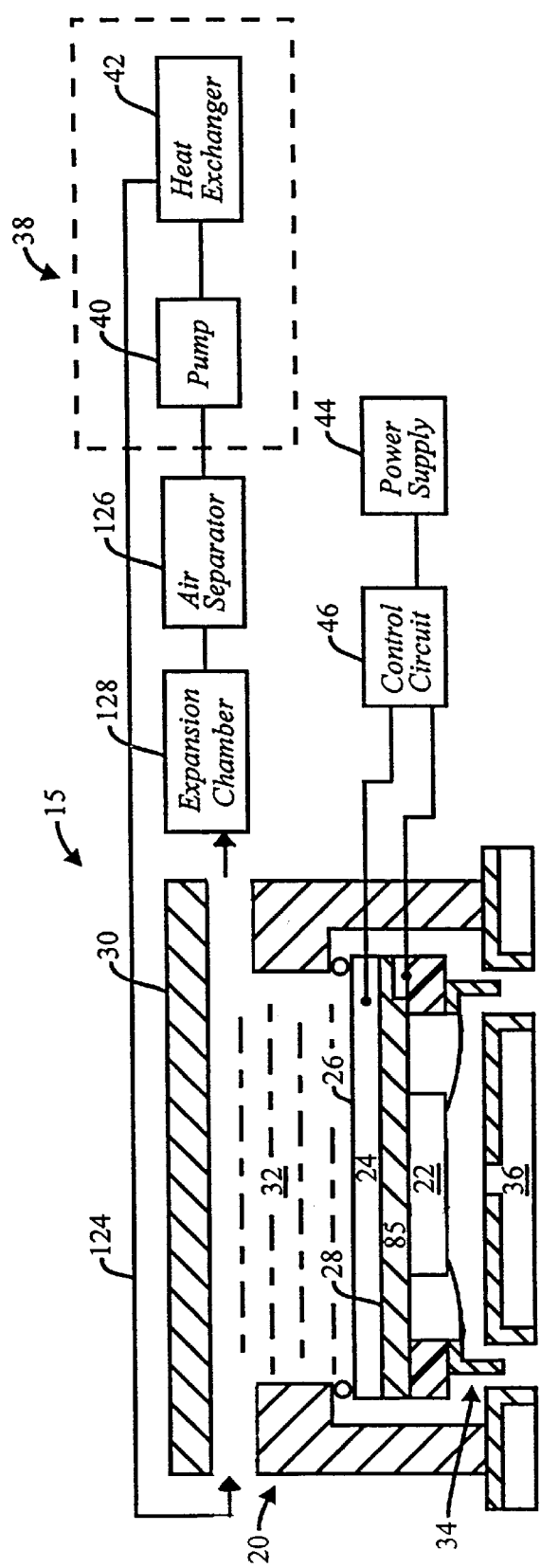
FIG. 1 is a schematic diagram of a cooling system of the present invention.

FIG. 1 illustrates one version of the cooling system 15 of the present invention that is suitable for cooling at least one electronic device 22. The cooling system 15 includes a cooling apparatus 20 comprising a thermoelectric cooler 24 having a hot surface 26 and a cold surface 28, the cold surface 28 in thermal contact with the electronic device 22 to be cooled. A fluid circulator 30 is in thermal contact with the hot surface 26 of the thermoelectric cooler 24, and is capable of flowing heat transfer fluid therein for transporting heat from the hot surface 26 of the thermoelectric cooler 24 to an environment remote from the electronic device 22. A thermal insulator 34 is provided for thermally isolating the electronic device 22 from the contiguous electrical circuit environment 36, so that the electronic device 22 is cooled substantially without condensation forming on the electronic device 22 or contiguous environment. Typically, the thermal insulator 34 comprises a thermally insulative support which holds the electronic device 22 in thermal contact against the cold surface 28 of the thermoelectric cooler 24, without transmitting thermal stresses therebetween.

The cooling system 15 uses a heat dissipator 38 to dissipate heat absorbed by the heat transfer fluid 32 at a location remote from the electrical circuit 36. Generally, the heat dissipator 38 comprises (i) a pump 40 for circulating heat transfer fluid 32 through the fluid circulating container of the cooling apparatus 20, (ii) a heat exchanger 42 for dissipating heat from the heat transfer fluid 32 to the environment, the heat exchanger 42 typically including a radiator and a fan capable of blowing air through the radiator. A power supply 44 is used for powering the apparatus 20 and control circuits 46. The control circuits 46 control the power to the apparatus 20 and regulate the temperature of the electronic device 22.

Figure 2:
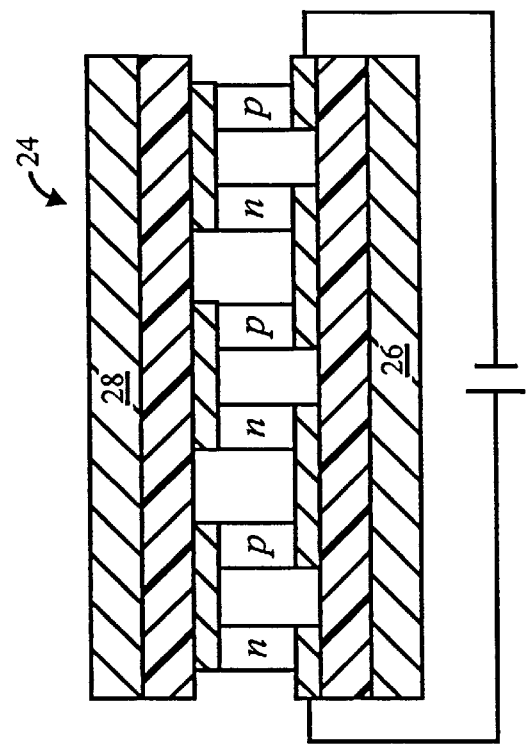
FIG. 2 is a cross-sectional schematic side view of a thermoelectric cooler of the cooling system of FIG. 1.

Particular aspects of the apparatus 20 of the present invention will now be described. The thermoelectric cooler 24 can be any conventional thermoelectric cooler 24, as schematically illustrated in FIG. 2. A typical thermoelectric element cooler 24 comprises heavily doped n-type and p-type semiconductor elements, typically made of bismuth telluride, that are electrically connected in a series arrangement by conductor strips to form thermoelectric couples. Electrical insulator plates serve as the cold 28 and hot surfaces 26 of the thermoelectric element. The cold surface 28 of the thermoelectric cooler 24 is placed in thermal contact with the electronic device 22. At the cold surface 28, heat is absorbed by electrons as the electrons jump from a low energy level in the p-type doped semiconductor element to a high energy level in the n-type semiconductor element. A power source supplies dc current to the conductor strips at the hot surface 26 to move the electrons through the semiconductor elements. At the hot surface 26, energy is expelled from the electrons, as the electrons jump from the higher energy levels in the n-type element to lower energy levels in the p-type element. In this manner, heat absorbed at the cold surface 28 of the thermoelectric elements is transported to the hot surface 26 at a rate proportional to the amount of current passing through the circuit. The amount of heat absorption increases as the number of thermoelectric couples increases. Suitable thermoelectric components include the CP 2-127-06L, which is commercially available from MELCOR Corporation, Trenton, N.J.

With reference to FIGS. 3 and 4, a fluid circulator 30 is positioned in thermal contact with the hot surface 26 of the thermoelectric cooler 24, to transport heat from the hot surface 26 of the thermoelectric cooler 24 to an environment remote from the electronic device 22. A suitable fluid circulator 30 structure comprises a hollow container having a top wall 60*a*, external sidewalls 60*b*, and internal sidewalls 60*c*. When held to the thermoelectric cooler 24, the container forms an enclosed structure having channels 70 therein for circulating flowing heat transfer fluid 32 therethrough, in direct contact with the hot junction of the thermoelectric chip. A gasket 71, such as an O-ring seal, silicone, rubber, or thermal adhesive, is positioned between the external sidewalls 60*b* and the thermoelectric cooler 24 to form a sealed surface that prevents leakage of heat transfer fluid 32 from the fluid circulator 30. Retaining pins 72, such as screws, are used to hold the thermoelectric cooler 24 firmly against a ledge 73 of the fluid circulator 30 so that the gasket 71 is compressed and seals the fluid circulator 30. Instead of retaining screws, alternative conventional retaining means, such as pins or clamps, can also be used. Preferably, an insulator pad 74 is positioned between the retaining pins 72 and the thermoelectric cooler 24.

In a preferred version, the external sidewalls 60*b* of the fluid circulating container are thermally conductive and partially enclose the electronic device 22. The thermally conductive sidewalls conduct heat from the hot junction of the thermoelectric cooler 24, and serve as a passive heat load surrounding the cold electronic device 22 that prevents ambient moisture condensation and frost formation on the adjacent electrical circuit board 55. The external sidewalls 60*b* when attached to the electrical circuit board 55 prevent ambient air and moisture from contacting the cooled electronic device 22, thus preventing condensation from forming on the electronic device 22. More preferably, the external sidewalls 60*b* and top wall 60*a* of the container are also electrically conductive and function as electrical shield walls to suppress the electromagnetic interference (EMI) generated by the electronic device 22 so that it does not interfere with the surrounding electrical environment. The fluid circulator container can also have a bottom wall 60*d* having thermal conductivity sufficiently elevated to transfer heat from the thermoelectric device 22 to the heat transfer fluid 32 in the fluid circulating container. Typically, the container is machined from a metal such as aluminum, or molded from polymeric materials, and mounted to the electrical circuit board 55 using conventional means.

With reference to FIG. 4, the channels 70 within the fluid circulating container are arranged so that the heat transfer fluid 32 flows in a circuitous path therethrough, to maximize the area of the hot junction that is exposed to the heat transfer fluid 32. A suitable channel arrangement comprises a plurality of interconnected U-shaped channels 70, each section of the channel typically having a width of about 5 to 20 mm, and being from about 10 to 50 mm long. Preferably, the inlet 75 and outlet 80 of the fluid channels 70 terminating on the same side of the fluid circulating container. More preferably, the inlet 75 and outlet 80 of the channels 70 are tapered with a first smaller width sized to correspond to the width of the channels 70, and a second larger width sized to fit the outlet 80 junction fittings, as shown in FIG. 1. Suitable junction fittings include ⅛ B6, commercially available from Mem-Co, Inc., Atkinson, N.H.

A heat transfer fluid 32 is circulated in the channels 70 of the fluid circulator 30. By heat transfer fluid it is meant any gas or liquid that is capable of absorbing heat from the thermoelectric cooler 24. Preferably, the heat transfer fluid 32 has an elevated thermal conductivity to maximize heat absorption by the fluid. Preferred heat transfer fluids include water, silicone fluid, freon-based coolants, and $CF_4$. Helium and liquid nitrogen can be also be used.

Preferably, a support 85 such as a conductive metal sheet is used to support the electronic device 22 and serves as a thermal coupler to thermally couple the electronic device 22 to the thermoelectric cooler 24 to maximize heat transfer therebetween. Thermally conductive grease, or metal foil, can also be inserted between the support 85 and the electronic device 22. The thermally conductive grease allows thermally coupling of the electronic device 22 to the thermoelectric cooler 24 substantially without transferring thermal expansion stresses between the thermoelectric cooler 24 and electronic device 22.

A thermal insulator structure 34, hereinafter referred to as a "thermal insulator" for convenience, is provided for thermally isolating the electronic device 22 from the contiguous electrical circuit environment 36, so that the electronic device 22 can be cooled substantially without condensation forming (i) on the electronic device 22, and (ii) on the contiguous electrical circuit 36. The thermal insulator 34 thermally isolates the cold surface 28 of the thermoelectric conductor and the adjacent cooled electronic device 22, from the surrounding electrical circuit 36, to allow the electronic device 22 to be cooled to temperatures below ambient temperatures without cooling the surrounding electrical circuit 36. Thermal isolation can be achieved by surrounding the cooled electronic device 22 and the cold surface 28 with a thermally insulative structure that either (i) is made of a material having a low thermal conductivity, or (ii) reduces the thermal contact area of any structure that allows heat transfer from the thermoelectric cooler 24 or electronic device 22 to the contiguous environment, such as the connecting wire leads 100, or (iii) increases the length of the any structure that allows heat transfer from the thermoelectric cooler 24 or electronic device 22 to the contiguous environment. Although preferred thermal insulator structures 34 are described to illustrate the invention, it should be understood that the invention includes any structure capable of thermally isolating the electronic device 22, as would be apparent to those skilled in the art.

In the version illustrated in FIGS. 3 and 5, the thermal insulator 34 comprises a rigid thermally insulative sheet 90 having an annular portion 92 with cut-out region 94 sized to surround the electronic device 22 so that the air gap in the cut-out region 94 between the electronic device 22 and the annular portion 92 of the insulative sheet serves to thermally insulate the electronic device 22. A suitable thermally insulative sheet comprises a FR-4 sheet, commercially available from Hadco, San Jose, Calif. The gap between the electronic device 22 and the annular ring should be at least about 0.02" wide. The annular portion 92 surrounding the integrated circuit chip contains conductive plated lines having holes 96 with a diameter sized to fit mounting pins 98. Thin wire leads 100 extending from the integrated circuit chip are connected to the plated lines on the annular portion 92, as shown in FIGS. 3 and 5, using conventional means, such as solder, compression bonding, or thermally conductive adhesives. The diameter of the wire leads 100 are sized sufficiently small that the leads 100 conduct substantially no heat, a suitable diameter being from about 25 to about 175 microns (1 to 5 mils), and more preferably from 25 to 50 microns. Mounting pins 98 are press mounted in the holes 96 of the plated lines. The mounting pins 98 can be soldered into holes in the printed circuit board 55, to electrically connect the electronic device 22 to the external electrical circuitry. The electronic device 22 is held onto a support 85, that also serves as a thermal coupler, such as an aluminum sheet, mounted onto the thermally insulative sheet 90. The thermally insulative sheet, the air gap surrounding the electronic device 22, and the fine connecting wires that conduct little heat, serve to thermally isolate the electronic device 22 from the surrounding electrical circuitry.

Referring now to FIG. 6, another thermal insulator structure 34 comprises a flexible insulative sheet 110 that is sufficiently flexible to absorb thermal stresses resulting from thermal expansion or contraction of the cooled electronic device 22, thermoelectric cooler 24, and fluid circulating container 30. Thermal stresses can cause the various components to warp or break. Thermally insulative materials that have the desired flexibility include polymeric materials, such as polyimide. In this version, a thermally insulative support post 116 is used to press the hot surface 26 of the thermoelectric cooler 24 against the fluid circulator 30. The fluid in the fluid circulating container is sealed therein by a gasket 118 mounted at the periphery of the thermoelectric cooler 24. Preferably, the flexible thermal insulator 110 comprises thin plated traces 112 for connecting the electrical contacts of the electronic device 114 to the electrical circuit board 55, the cross-sectional area of an electrical traces is sized sufficiently small that the traces are substantially thermally insulative, a suitable trace having an area of from about $2 \times 10^{-6}$ to $5 \times 10^{-6}$ $in^2$. In a preferred configuration useful for thermally isolating existing pin grid array chip packages, the flexible thermal insulator 110 comprises a looped flex circuit having plated traces 112 corresponding to the pattern of pins or ball contacts on the integrated circuit chip package, as shown in FIGS. 8 and 9. To attach the electronic device 22, a coating of solder is applied on one end of the plated traces 112, and the contacts of the packaged electronic device 114, such as the pin or ball solder contacts, are soldered on the leads. The flex circuit is folded back, so that the other ends of the plated traces 112 are positioned on desired connection points on the printed circuit board, as shown in FIG. 7, and soldered thereon. When the packaged electronic device 22 uses connector pins, the active pins 114*a* used for electrical connection to the device 22 are shortened and soldered to the flex circuit, while other passive pins 114*b* are inserted in alignment holes 120 in the flex circuit to align the packaged electronic device 22 to the flex circuit. An insulative polymeric support 122 molded to conform to the cross-section of the looped flex circuit, as shown in FIG. 9, can be used to support the flex circuit and to press the electrical connection points against one another, eliminating the need for soldering. An insulator 113 is used to hold the electronic device 22 against the thermoelectric cooler 24. The looped flexible sheet, in combination with the fine wire leads 100, thermal isolates the electronic device 22 while providing an electrically connection to the electronic device 22.

It is preferred to use a portable heat dissipator 38 to dissipate heat from the heat transfer fluid 32 at a location remote from the electrical circuit 36. The portable heat dissipator 38 allows cooling of electronic devices in conventional desktop (or pedestal) computers, without expensive adaptations, allowing quick and easy retrofitting of conventional computer systems. Also, the portable heat dissipator allows dissipation of the heat generated in desktop computers outside of the computer, without heating-up of the computer. A suitable portable heat dissipator 38 comprises a housing containing (i) a pump 40 for circulating heat transfer fluid 32 through the fluid circulating container of the cooling apparatus 20, and (ii) a heat exchanger 42 for dissipating heat from the heat transfer fluid 32 to the environment. Fluid flow tubes 124 allow the heat transfer fluid 32 to flow through the pump 40, fluid circulator 30 and heat dissipator 38. A preferred portable heat dissipator 38 comprises a housing with a bottom wall, a back wall, and a removable top cover that forms the top wall, sidewalls and front walls of the housing to provide easy access to the components in the housing (not shown). The housing is typically made of metal or injection molded polymer. Port openings are provided for electrical wires and fluid tubes to enter the housing.

The pump 40 in the housing pumps the heat transfer fluid 32 through the fluid flow tubing 124 connected to the fluid circulating container to maintain a flow of fluid in the fluid circulating container. Suitable pumps include the MARCH 1AC-MD, commercially available from March Manf., Glenview, Ill. Preferably, the fluid flow tubing 124 includes (i) an air separator 126 that removes air bubbles from the fluid, and (ii) an expansion region 128 that allows the fluid to thermally expand during operation of the cooling system 15. A preferred structure that serves as a combination air separator 126 and expansion region comprises a T-shaped tube 130 having a lip 132 positioned immediately before the T-shaped tube 130, along the flowing fluid tube, as shown in FIG. 10. The lip 132 causes turbulence within the fluid flowing through the tube, which results in the air bubbles separating from the fluid, and flowing into the upright portion of the T-shaped tube 130, which has a closed end 134. The T-shaped tube 130 is sized sufficiently long to allow an expanded fluid volume to flow into the tube without overflowing, a suitable length being from 6 to 18 inches (15 to 45 cms).

The heat exchanger 42 in the housing is placed along the fluid tubing 124 to dissipate heat from the heat transfer fluid 32 to the external environment. The heat exchanger 42 comprises a radiator with a continuous tube having a plurality of high surface area fins mounted thereon, the fins typically being about 30 microns (5.5 mils) thick. A suitable tube is made from copper and has a length of about 50 to 150 cms, and has a diameter of about 0.5 cm to about 2 cms. A blower, such as directed flow fan, forces air through the fins of the radiator to remove heat from the fluid flowing in the tubes, at a rate of about 50 to about 500 Watts/min, and more preferably from 100 to 300 Watts/min. Preferably, the heat transfer fluid 32 is maintained at ambient temperatures to maximize cooling of the hot side of the thermoelectric cooler 24. Venting holes are formed in the back wall of the housing to allow the air forced through the radiator to escape from the housing. In this manner, the heat dissipator 38 dissipates heat at a location remote from, and preferably outside, the enclosure holding the electrical circuit 36 and electronic devices 22.

The thermoelectric cooler 24 is operated by a power supply 44 and control circuitry 46, that are preferably located in a portable housing. Any conventional power supply 44 capable of powering the thermoelectric cooler 24 can be used.

A preferred control circuit 46 suitable for controlling the power to the electronic device 22, thermoelectric cooler 24, and pump 40 will now be described, with reference to FIG. 11. The control circuit 46 operates by comparing a signal corresponding to a temperature $T_o$ measured by a temperature sensor 148 to preset cold temperatures $T_c$ and preset hot temperatures $T_h$. The temperature sensor 148 is mounted contiguous to the electronic device 22, for example in a hole or slot in the support 85, to measure the temperature of the electronic device 22. The control circuit 46 comprises a resistor bridge 150 including (i) a fixed resistor 152, and (ii) a temperature sensor 148, such as a resistance temperature detector (RTD) or thermistor, is used to provide a signal voltage that changes as a function of the change in resistance of the temperature sensor, suitable RTDs and thermistors are made by Omega Engineering, Stamford, Conn. A first voltage comparator circuit 160 compares the signal voltage to a preset reference voltage $V_{R1}$ corresponding to a low preset temperature $T_c$. When the signal voltage is less than or equal to the preset reference voltage $V_{R1}$, the first voltage comparator circuit 160 powers a coil of the first relay 162 which allows power to flow to the electronic device 22. A suitable comparator is a CA3098 commercially available from Harris Corporation. Preferably, a first one-shot latch 164 is used in the first voltage comparator circuit 160. The first one-shot latch 164 closes when the first voltage comparator circuit 160 initially powers the first relay 162, and remains closed even if the measured temperature falls below the low preset temperature $T_c$, to prevent shut-off of power to the electronic device 22, for minor variations in temperature of the electronic device 22, after the electronic device 22 is initially powered-up. In FIG. 11, "com" indicates the negative terminal of a 12 volt dc power supply 44.

A second voltage comparator circuit 170 compares the signal voltage to a preset reference voltage $V_{R2}$ corresponding to a high preset temperature $T_h$. When the signal voltage is less than or equal to the preset reference voltage $V_{R1}$, the second voltage comparator circuit 170 powers a coil of second relay 172. The second relay 172 allows power to flow to the first relay 162, and if the first relay 162 is closed, the electronic device 22 is powered and a power-on LED is activated. Preferably, a second one-shot latch 174 in the second voltage comparator circuit 170, opens when the second voltage comparator circuit 170 initially opens the second relay 172, and remains open even if the temperature $T_o$ falls below the high preset temperature $T_h$, to prevent turn-on of the electronic device 22 after the device 22 cools down. The reference voltages corresponding to the preselected temperatures $T_c$ and $T_h$ are set by selecting a voltage reference chip that provides the desired voltage.

In this manner, the control circuit 46 serves as a safety power(on/off) control circuit 46 that applies power to the electronic device 22 only when the temperature of the electronic device 22 $T_o$, satisfies the relationship $T_c \geq T_o \leq T_h$. The control circuit 46 connects the power to the electronic device 22 only after the electronic device 22 is at a temperature less than or equal to the preset cold temperature $T_c$. This function prevents powering up of the electronic device 22 before the electronic device 22 is at the desired cold temperature. This is important because prior to use of the cooling apparatus 20, the electronic device 22 is reset to operate at a higher operating frequency to take advantage of the cooler operating temperatures allowed by the cooling apparatus 20. Operation of the electronic device 22 before it reaches the cold temperature $T_c$ can result in unreliable performance of the electronic device 22. Also, when the cooling apparatus 20 is not functional, or does not properly cool the electronic device 22 at start-up, the control circuit 46 will not power-up the electronic device 22. A suitable $T_c$ varies with the desired operating temperature of the electronic device 22 $T_o$. Preferably, the operating temperature $T_o$ is equal to $T_c$ and is from about −40° C. to 30° C. Furthermore, the control circuit 46 disconnects the power supply 44 from the electronic device 22 when the temperature of the electronic device 22 exceeds a preset hot temperature $T_h$. This function is useful to protect the electronic device 22 during operation of the cooling system 15, when the thermoelectric cooler 24 or fluid circulator 30 is disconnected, or otherwise fails to cool the electronic device 22. A suitable $T_h$ is about 40° to 90° C.

In a second function, the control circuit 46 shuts-off the pump 40, when the temperature of the electronic device 22 exceeds the preset hot temperature $T_h$. The pump 40 is powered by the second relay 172, which is closed by the second voltage comparator circuit 170, when the first signal voltage is greater than or equal to the preset reference voltage $V_{R1}$. This function stops pumping heat transfer fluid 32 through the cooling system 15, when the cooling system 15 fails.

In a third function, the control circuit 46 shuts-off the power to the thermoelectric cooler 24 when the temperature of the electronic device 22 exceeds the preset hot temperature $T_h$. The thermoelectric cooler 24 is powered through a third relay 180 having a single pole double throw switching system. The third relay 180 is closed by the second voltage comparator circuit 170 only when the first signal voltage is less than or equal to the preset reference voltage $V_{R1}$. This function shuts-off the thermoelectric cooler 24 in the event of failure of the cooling system 15, and indicates over temperature by activating an over-temperature LED, and optionally a sound alarm.

Optionally, a temperature control circuit 190 can be used to control the temperature of the thermoelectric cooler 24 to maintain the electronic device 22 at an operating temperature $T_o$ within a range of temperatures ΔT selected to surround the desired operating temperature. For example, if it is desired to operate the electronic device 22 at an operating temperature $T_o$ of about −10° C., a suitable ΔT is from −15° C. to −5° C., and more preferably from about −11° C. to −9° C. The temperature control circuit 190, typically comprising a solid state relay 192 in conjunction with a signal invertor 194, is capable of rapidly turning on/off the power applied to the thermoelectric cooler 24 to control the temperature of the thermoelectric cooler 24. The solid state relay 192 uses the inverted output signal from the first comparator to control a high amperage output signal to the thermoelectric cooler 24. The current would then flow through the thermoelectric cooler 24 and the solid state relay 192 to com, instead of directly to com as shown in FIG. 11. Alternatively, a variable output solid state relay (not shown) can also be used to provide a variable output current to the thermoelectric cooler 24. The entire control circuit can be substituted using a commercially available temperature controller, such as an Omega CN76000 controller with two outputs and an alarm system, commercially available from Omega Engineering, Stamford, Conn.

Preferably, a control panel mounted on the front wall of the portable housing can be used to mount power on/off switches, the "over temperature" and "power-on" light emitting diodes, and a digital temperature selector. Optionally a digital temperature indicator can also be mounted on the control panel to indicate the actual operating temperature of the electronic device 22.

Figure 12B:
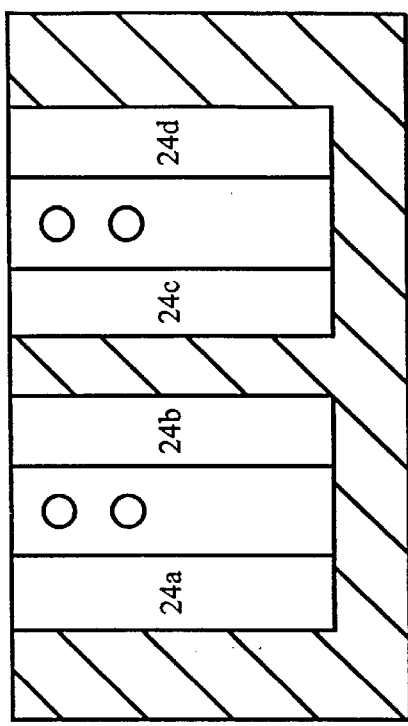
FIG. 12b is a cross-sectional schematic side view of multiple thermoelectric modules arranged in parallel.
Figure 12D:
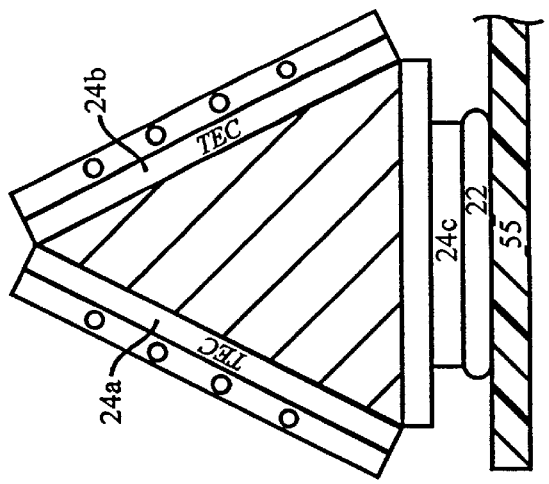
FIGS. 12c and 12d are cross-sectional schematic side views of multiple thermoelectric modules arranged in parallel connected to another thermoelectric module in series.
Figure 12A:
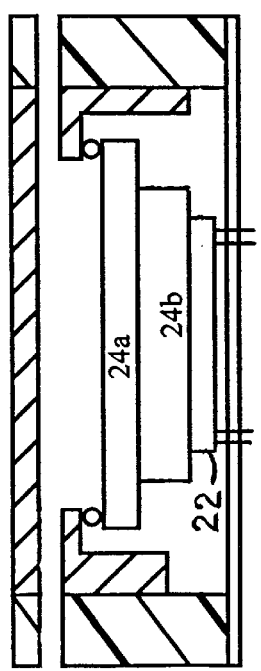
FIG. 12a is a cross-sectional schematic side view of multiple thermoelectric modules arranged in series.
Figure 12C:
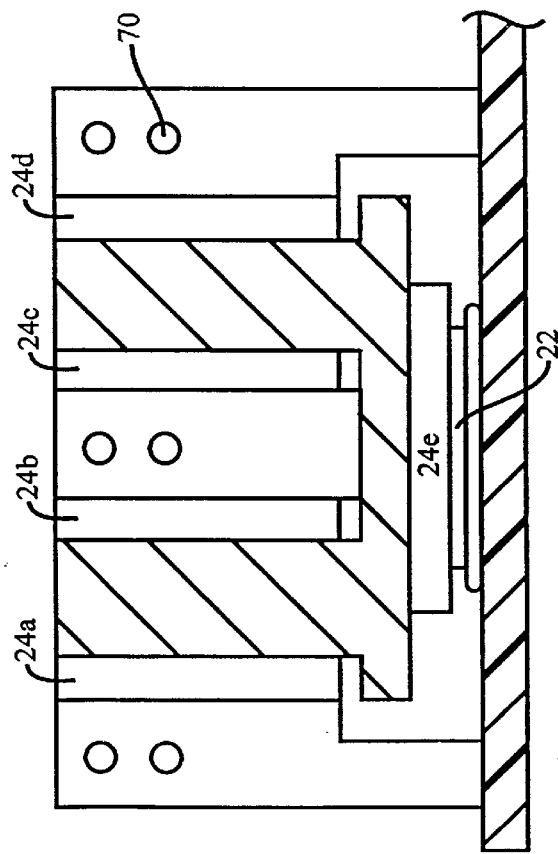

Alternate and preferred versions of the invention will now be described. In one preferred version, the thermoelectric cooler 24 comprises multiple thermoelectric modules 24a–e, arranged to maximize cooling of the electronic device 22, as shown in FIGS. 12a to 12d. In FIG. 12a, thermoelectric modules 24a, 24b are positioned in a series arrangement, where the cold surface 28 of one thermoelectric module 24a is in thermal contact with the hot surface of a second thermoelectric module 24b thereby achieving a lower operating temperature. In another arrangement, the thermoelectric modules are positioned substantially perpendicular to the electronic device 22 with thermally conductive plates contacting the cold surface of the thermoelectric modules 24a–d, as shown in FIG. 12b. In a third arrangement, a first thermoelectric module 24e is positioned parallel to the electronic device 22 and other thermoelectric modules 24a–d are positioned perpendicular to the electronic device 22, as shown in FIG. 12c. In a fourth arrangement, the thermoelectric modules 24a–c are positioned in a triangulated arrangement, as shown in FIG. 12d. In these versions, the channels 70 in the fluid circulator container are positioned between hot surfaces 26 of the thermoelectric modules to circulate the heat transfer fluid therethrough.

Figure 13:
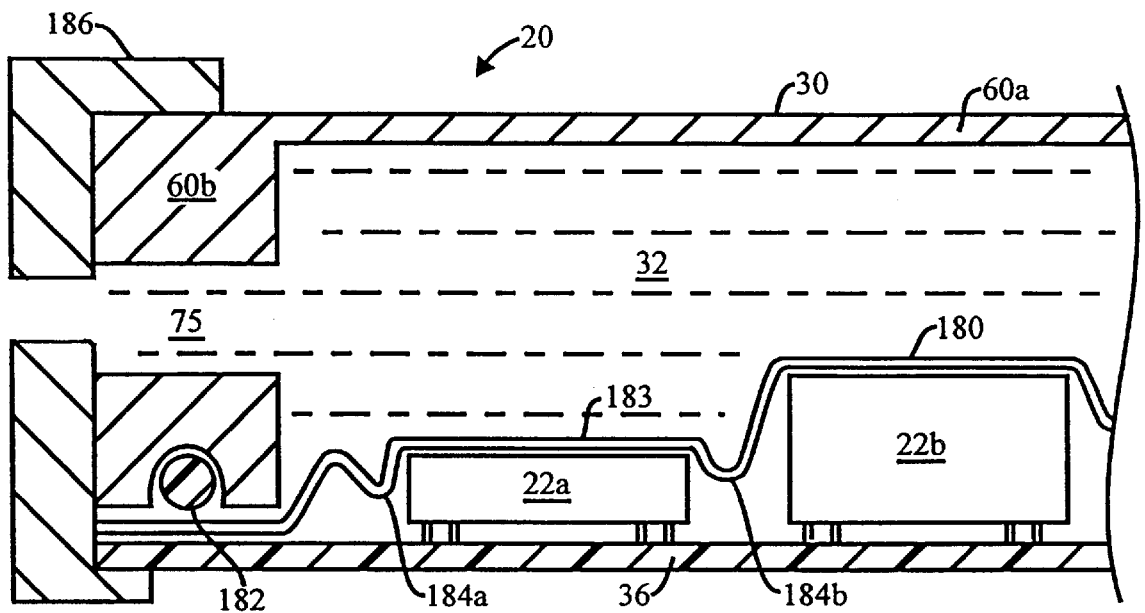
FIG. 13 is a partial cross-sectional schematic side view of another version of the cooling apparatus of the present invention.
Figure 14:
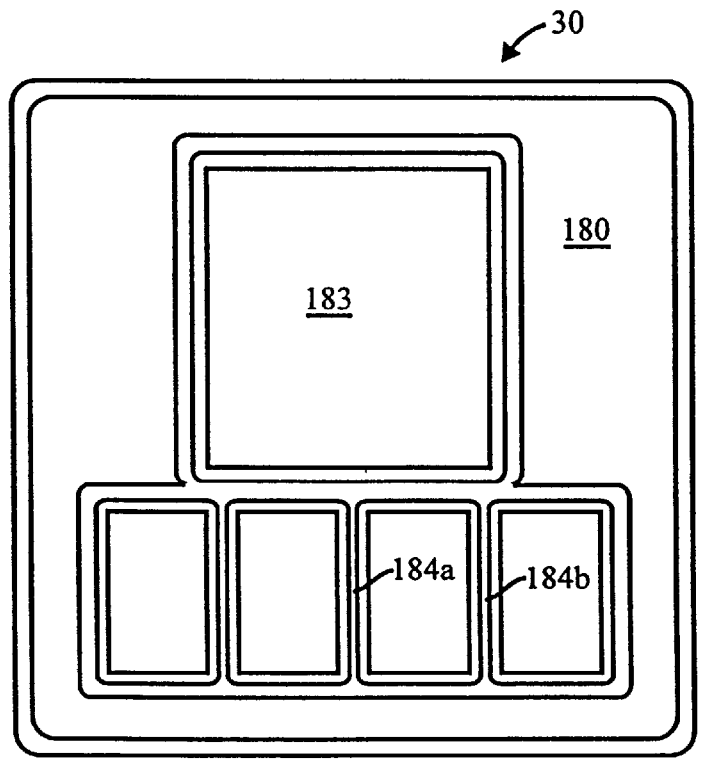
FIG. 14 is a schematic top view of the flexible thermally conductive sheet used in the apparatus of FIG. 13.

Another preferred embodiment is useful for cooling a collection of electronic devices 22a, 22b mounted adjacent to one another on a printed circuit board, as shown in FIG. 13. The collection of electronic devices 22a, 22b have an irregular surface topology because of the different dimensions of the electronic devices 22, such as the varying heights and surface areas of electronic devices 22. In this embodiment, a compliant thermally conductive sheet 180 is placed between the electronic devices 22 and the fluid circulator 30. The fluid circulator 30 can be used to cool the electronic devices 22a, 22b without use of a thermoelectric cooler 24, as shown in FIG. 13. Alternatively, a thermoelectric cooler 24 can be positioned between the fluid circulator 30 and the electronic devices, as previously described (not shown). The compliant thermally conductive sheet 180 allows the cooling apparatus 20 to substantially uniformly cool the entire collection of electronic devices 22a, 22b. A suitable compliant thermally conductive sheet 180 comprises a thin metal sheet, such as a stamped copper sheet, or flexible thermally conductive elastomer that is molded by stamping or pressing to conform to the irregular surface topology of the electronic devices 22a, 22b. The compliant thermally conductive sheet 180 forms a bottom wall of the fluid circulating container, which in combination with a gasket 182, such as O-ring seals or thermal adhesive, forms a sealed surface that prevents leakage of heat transfer fluid 32 in the fluid circulator 30. A preferred compliant thermally conductive sheet 180 includes flat portions 183 corresponding to the dimensions of the packaged electronic devices, with small bends 184a, 184b between the flat portions 183, that allow for small variations in height of the electronic devices 22a, 22b, as shown in FIGS. 13 and 14. Alternatively, thermal adhesive can also be used to attach the flexible thermally conductive sheet to the electronic devices 22a, 22b. A snap holder 186 can also be used to hold the cooling apparatus 20 to the electronic devices 22a, 22b. This version is useful for cooling electronic devices 22 that operate at relatively high temperatures.

Although the present invention has been described in considerable detail with regard to preferred versions thereof, other versions are possible. For example, cooling devices equivalent in function to thermoelectric coolers can be used without departing from the scope of the present invention. Therefore, the appended claims should not be limited to the descriptions of the preferred versions contained herein.

What is claimed is:

1. A cooling apparatus for cooling at least one electronic device, the apparatus comprising:
    (a) a thermoelectric cooler having a hot surface and a cold surface, the cold surface in thermal contact with the electronic device;
    (b) a fluid circulator in thermal contact with the hot surface of the thermoelectric cooler, the fluid circulator comprising a container having channels capable of flowing heat transfer fluid therein for transporting heat from the hot surface of the thermoelectric cooler to an environment remote from the electronic device, the container comprising walls that partially enclose the electronic device; and
    (c) a thermal insulator that thermally isolates the electronic device from a contiguous electrical circuit, so that the electronic device is cooled substantially without condensation forming on the electronic device and contiguous electrical circuit.

2. The apparatus of claim 1, wherein the thermal insulator comprises a thermally insulative support which holds the electronic device in thermal contact against the cold surface of the thermoelectric cooler, without transmitting thermal stresses therebetween.

3. The apparatus of claim 2, wherein the thermal insulator comprises wire leads for connecting the electrical contacts of the electronic device to the electrical circuit, the wire leads having a diameter sized sufficiently small that the wire leads are substantially thermally insulative.

4. The apparatus of claim 2, wherein the thermal insulator comprises a flexible thermally insulative sheet having electrically conductive traces thereon, at least a portion of the traces having a cross-sectional area sized sufficiently small that the traces are substantially thermally insulative.

5. The apparatus of claim 4, wherein the flexible thermally insulative sheet is configured to absorb thermal stresses generated during cooling of the electronic device.

6. The apparatus of claim 1, wherein the container of the fluid circulator includes a compliant gasket for sealing a peripheral edge of the container to prevent leakage of heat transfer fluid.

7. The apparatus of claim 1, wherein the walls of the container of the fluid circulator comprise an electrical conductivity sufficiently high to serve as electrical shield walls that suppress electromagnetic interference generated by the electronic device.

8. The apparatus of claim 1, wherein the walls of the container of the fluid circulator have a thermal conductivity sufficiently elevated to transfer heat absorbed by the heat transfer fluid in the container to the walls and to the contiguous electrical circuit, so that the electronic device is cooled substantially without condensation forming on the contiguous electrical circuit.

9. The apparatus of claim 8, wherein the walls of the container of the fluid circulator contact the contiguous electrical circuit to form a seal enclosing the electronic device that prevents ambient moisture from contacting and condensing on the electronic device.

10. The apparatus of claim 1, further comprising a temperature sensor capable of measuring the temperature of the electronic device.

11. The apparatus of claim 10, further comprising a control circuit for comparing a signal corresponding to a temperature $T_o$ measured by the temperature sensor to a preset cold temperature $T_c$, wherein when $T_o \leq T_c$, the control circuit is capable of connecting the power supplied to the electronic device.

12. The apparatus of claim 10, further comprising a control circuit for comparing a signal corresponding to a temperature $T_o$ measured by the temperature sensor to a preset hot temperature $T_h$, wherein when $T_o \geq T_h$, the control circuit is capable of disconnecting the power supplied to at least one of the following:
    (a) the electronic device;
    (b) the pump; or
    (c) the thermoelectric cooler.

13. The apparatus of claim 10, further comprising a temperature control circuit for comparing a signal corresponding to a temperature $T_o$ measured by the temperature sensor to a preset temperature range $\Delta T$, wherein the control circuit connects and disconnects power to the thermoelectric cooler to maintain the electronic device at a temperature within $\Delta T$.

14. The apparatus of claim 10, further comprising a temperature control circuit for comparing a signal corresponding to a temperature $T_o$ measured by the temperature sensor to a preset temperature range $\Delta T$, wherein the control circuit increases the current applied to the thermoelectric cooler when $T_o$ is higher than the temperature range $\Delta T$, and decreases the current applied to the thermoelectric cooler when $T_o$ is lower than the temperature range $\Delta T$.

15. The apparatus of claim 1, further comprising a thermal coupler for thermally coupling the electronic device to the thermoelectric cooler to allow heat to flow from the electronic device to the thermoelectric cooler substantially without transferring thermal expansion stresses between the thermoelectric cooler and electronic device.

16. The apparatus of claim 1, further comprising a portable heat dissipator capable of dissipating heat from the heat transfer fluid at a location remote from the electrical circuit, the device comprising:
    (a) a pump for circulating heat transfer fluid through the fluid circulating container of the cooling apparatus; and
    (b) a heat exchanger for dissipating heat from the heat transfer fluid.

17. The apparatus of claim 16, wherein the electrical circuit is mounted in an enclosure, and wherein the heat dissipator dissipates heat outside the enclosure.

18. A method of cooling at least one electronic device electrically connected to an electrical circuit, the method comprising the steps of:
    (a) thermally isolating the electronic device from the electrical circuit;
    (b) thermally coupling a cold surface of a thermoelectric cooler to the electrical device; and
    (c) thermally coupling a hot surface of the thermoelectric cooler to a fluid circulator and flowing heat transfer fluid through channels of a container of the fluid circulator to transport heat from the hot surface of the thermoelectric cooler to a remote environment to cool the thermally isolated electronic device substantially without condensation forming on the electronic device and electronic circuit; and
    (d) partially enclosing the electronic device by walls extending from the container to shield the electronic device and suppress electromagnetic interference generated by the electronic device.

19. The method of claim 18, further comprising the step of electrically connecting the electronic device to the electrical circuit using a flexible connector that is sufficiently flexible to absorb thermal stresses generated during cooling of the electronic device.

20. The method of claim 18, further comprising the steps of:
    (a) measuring a signal corresponding to an operating temperature $T_o$ of the electronic device using a temperature sensor;
    (b) comparing the temperature $T_o$ to a preset cold temperature $T_c$, and when $T_o \leq T_c$, supplying power to the electronic device.

21. The method of claim 18, further comprising the steps of:
    (a) measuring a signal corresponding to an operating temperature $T_o$ of the electronic device using a temperature sensor;
    (b) comparing the temperature $T_o$ to a preset hot temperature $T_h$, and when $T_o \geq T_h$, disconnecting the power supplied to at least one of the following:
      i) the electronic device;
      ii) the pump; or
      iii) the thermoelectric cooler.

22. The method of claim 18, further comprising the steps of:
    (a) measuring a signal corresponding to an operating temperature $T_o$ of the electronic device using a temperature sensor;
    (b) comparing the temperature $T_o$ to a preset temperature range $\Delta T$; and
    (c) controlling the current used to operate the thermoelectric cooler to maintain the electronic device at a temperature within the temperature range $\Delta T$.

23. A cooling apparatus for cooling one or more electronic devices on an electrical circuit, the apparatus comprising:
    (a) a thermoelectric cooler having a cold surface in thermal contact with the electronic devices; and
    (b) means for thermally isolating the electronic devices from the electrical circuit, wherein the thermally isolating means comprises at least one of the following:
      (1) a support that supports the electronic device substantially without transmitting thermal stresses therethrough;
      (2) wire leads for connecting electrical contacts of the electronic device to the electrical circuit, the wire leads having a diameter sized sufficiently small that the wire leads serve as thermal insulators; or
      (3) a flexible thermal insulator sheet having electrically conductive wire traces.

24. The apparatus of claim 23 further comprising a fluid circulator in thermal contact with a hot surface of the thermoelectric cooler to transport heat to a remote environment.

25. The apparatus of claim 23 wherein the thermally isolating means provides sufficient thermal insulation that the electronic device is cooled substantially without condensation forming on the electronic device and electrical circuit.

26. The apparatus of claim 23 wherein the thermoelectric cooler comprises a plurality of thermoelectric modules each having a cold surface in thermal contact with a thermal conductor contacting the electronic device.

27. A cooling apparatus for cooling one or more electronic devices in an electrical circuit, the apparatus comprising:
(a) a plurality of thermoelectric modules each comprising a cold surface contacting a thermal conductor in thermal contact with the electronic devices; and
(b) means for thermally isolating the electronic devices from the electrical circuit and for transporting heat away from the hot surface of the thermoelectric modules to a remote environment.

28. The apparatus of claim 27 wherein the thermoelectric modules are positioned (i) substantially parallel or to one another, (ii) substantially perpendicular to one another, (iii) in a triangulated arrangement, or (iv) in a combination of arrangements thereof.

29. The apparatus of claim 27 wherein the means for transporting heat away from the hot surface of the thermoelectric modules to a remote environment comprises a fluid circulator having a plurality of fluid channels in thermal contact with the hot surfaces of the thermoelectric modules to circulate heat transfer fluid therethrough.

30. A cooling apparatus for cooling at least one electronic device, the apparatus comprising:
(a) a thermoelectric cooler having a hot surface and a cold surface, the cold surface in thermal contact with the electronic device;
(b) a fluid circulator in thermal contact with the hot surface of the thermoelectric cooler, the fluid circulator capable of flowing heat transfer fluid therein for transporting heat from the hot surface of the thermoelectric cooler to an environment remote from the electronic device; and
(c) a thermal insulator that thermally isolates the electronic device from a contiguous electrical circuit environment, so that the electronic device is cooled substantially without condensation forming on the electronic device and contiguous electrical circuit, thermal insulator comprises a thermally insulative support which holds the electronic device in thermal contact against the cold surface of the thermoelectric cooler, without transmitting thermal stresses therebetween, and comprises wire leads for connecting the electrical contacts of the electronic device to the electrical circuit, the wire leads having a diameter sized sufficiently small that the wire leads are substantially thermally insulative.

31. The apparatus of claim 30, wherein the fluid circulator comprises a container having channels therein for circulating the heat transfer fluid therethrough.

32. The apparatus of claim 31, wherein the container of the fluid circulator includes a compliant gasket for sealing a peripheral edge of the container to prevent leakage of heat transfer fluid.

33. The apparatus of claim 31, wherein the container of the fluid circulator comprises electrical shield walls that partially enclose the electronic device to suppress electromagnetic interference generated by the electronic device.

34. The apparatus of claim 31, wherein the container of the fluid circulator comprises walls that partially enclose the electronic device, the walls having a thermal conductivity sufficiently elevated to transfer heat absorbed by the heat transfer fluid in the fluid circulating container to the walls and to the contiguous electrical circuit, so that the electronic device is cooled substantially without condensation forming on the contiguous electrical circuit.

35. The apparatus of claim 34, wherein the walls of the fluid circulator container contact the contiguous electrical circuit to form a seal enclosing the electronic device that prevents ambient moisture from contacting and condensing on the electronic device.

36. The apparatus of claim 30, wherein the thermoelectric cooler comprises a plurality of thermoelectric modules arranged so that a cold surface of each thermoelectric module is in thermal contact with the electronic device.

37. The apparatus of claim 36, wherein the fluid circulator comprises channels positioned between hot surfaces of the thermoelectric modules, the channels provided for circulating a heat transfer fluid therethrough.

38. The apparatus of claim 30, further comprising a flexible thermally conductive layer between the thermoelectric cooler and the electronic device, the flexible thermally conductive layer capable of conforming to an irregular surface topology of a plurality of electronic devices to enhance thermal conduction between the electronic devices and the thermoelectric cooler.

39. The apparatus of claim 30, further comprising a temperature sensor capable of measuring the temperature of the electronic device.

40. The apparatus of claim 39, further comprising a control circuit for comparing a signal corresponding to a temperature $T_o$ measured by the temperature sensor to a preset cold temperature signal $T_c$, wherein when $T_o \leq T_c$, the control circuit is capable of connecting the power supplied to the electronic device.

41. The apparatus of claim 39, further comprising a control circuit for comparing a signal corresponding to a temperature $T_o$ measured by the temperature sensor to a preset hot temperature signal $T_h$, wherein when $T_o \geq T_h$, the control circuit is capable of disconnecting the power supplied to at least one of the following:
(a) the electronic device;
(b) the pump; or
(c) the thermoelectric cooler.

42. The apparatus of claim 39, further comprising a temperature control circuit for comparing a signal corresponding to a temperature $T_o$ measured by the temperature sensor to a preset temperature range signal $\Delta T$, wherein the control circuit connects and disconnects power to the thermoelectric cooler to maintain the electronic device at a temperature within $\Delta T$.

43. The apparatus of claim 39, further comprising a temperature control circuit for comparing a signal corresponding to a temperature $T_o$ measured by the temperature sensor to a preset temperature range signal $\Delta T$, wherein the control circuit increases the current applied to the thermoelectric cooler when $T_o$ is higher than the temperature range $\Delta T$, and decreases the current applied to the thermoelectric cooler when $T_o$ is lower than the temperature range $\Delta T$.

44. A cooling apparatus for cooling one or more electronic devices in an electrical circuit, the apparatus comprising:
(a) a thermoelectric module comprising a cold surface and a hot surface, the cold surface being in thermal contact with the electronic device; and
(b) a fluid circulator comprising a container that is thermally coupled to the hot surface of the thermoelectric module, the container having channels for circulating a heat transfer fluid therethrough for transporting heat away from the hot surface of the thermoelectric module to a remote environment, and having walls that are sufficiently thermally conductive to serve as a passive heat load that thermally isolates the electronic devices from the electrical circuit and prevents condensation on the adjacent electrical circuit.

45. The apparatus of claim 44, further comprising wire leads for connecting the electrical contacts of the electronic device to the electrical circuit, the wire leads having a diameter sized sufficiently small that the wire leads are substantially thermally insulative.

46. The apparatus of claim 44, wherein the walls of the container of the fluid circulator comprise an electrical conductivity sufficiently high to serve as electrical shield walls that suppress electromagnetic interference generated by the electronic device.

47. The apparatus of claim 44, wherein the walls of the container of the fluid circulator have a thermal conductivity sufficiently elevated to transfer heat absorbed by the heat transfer fluid in the container to the walls and to the contiguous electrical circuit, so that the electronic device is cooled substantially without condensation forming on the contiguous electrical circuit.

48. The apparatus of claim 44, wherein the walls of the container of the fluid circulator contact the contiguous electrical circuit to form a seal enclosing the electronic device that prevents ambient moisture from contacting and condensing on the electronic device.

* * * * *